United States Patent
Zhang et al.

(10) Patent No.: US 10,340,854 B2
(45) Date of Patent: *Jul. 2, 2019

(54) SELECTING BETWEEN BOOSTED SUPPLY AND BATTERY SUPPLY

(71) Applicant: QUALCOMM Incorporated, San Diego, CA (US)

(72) Inventors: Zhiqing Zhang, San Jose, CA (US); Chi Fan Yung, Singapore (SG); Joseph Duncan, Carlsbad, CA (US); Jun Hua, San Diego, CA (US); Song Shi, San Diego, CA (US); Thomas Marra, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/643,124

(22) Filed: Jul. 6, 2017

(65) Prior Publication Data

US 2018/0034415 A1     Feb. 1, 2018

Related U.S. Application Data

(60) Provisional application No. 62/368,930, filed on Jul. 29, 2016.

(51) Int. Cl.
*H03F 1/30* (2006.01)
*H03F 1/02* (2006.01)
(Continued)

(52) U.S. Cl.
CPC .......... *H03F 1/0216* (2013.01); *H02M 3/155* (2013.01); *H03F 1/0227* (2013.01);
(Continued)

(58) Field of Classification Search
CPC ......................................................... H03F 1/30
(Continued)

(56) References Cited

U.S. PATENT DOCUMENTS

| 6,097,252 A * | 8/2000 | Sigmon ................. H03F 1/0222 330/124 R |
| 7,474,149 B2 * | 1/2009 | Snelgrove ............. H03F 1/0205 330/129 |

(Continued)

OTHER PUBLICATIONS

International Search Report and Written Opinion—PCT/US2017/041108—ISA/EPO—dated Sep. 18, 2017.

*Primary Examiner* — Henry Choe
(74) *Attorney, Agent, or Firm* — Patterson & Sheridan, L.L.P.

(57) ABSTRACT

Certain aspects of the present disclosure provide methods and apparatus for generating an envelope tracking power supply voltage. For example, certain aspects of the present disclosure provide an envelope tracking power supply having a linear amplifier having an output coupled to a power supply node of an amplifier, wherein a power supply node of the linear amplifier is coupled to a first voltage supply node. The envelope tracking power supply may also include a switch mode power supply having an output coupled to the power supply node of the amplifier. Certain aspects also include a circuit having a first switch coupled to the first voltage supply node and a second switch coupled to a second voltage supply node, wherein a power supply node of the switch mode power supply is coupled to the first switch and the second switch.

18 Claims, 9 Drawing Sheets

(51) Int. Cl.
  *H02M 3/155* (2006.01)
  *H03F 3/195* (2006.01)
  *H03F 3/213* (2006.01)

(52) U.S. Cl.
  CPC ............ *H03F 3/195* (2013.01); *H03F 3/213* (2013.01); *H03F 2200/102* (2013.01); *H03F 2200/294* (2013.01); *H03F 2200/451* (2013.01); *H03F 2200/504* (2013.01); *H03F 2200/511* (2013.01)

(58) Field of Classification Search
  USPC .................................................. 330/297, 136
  See application file for complete search history.

(56) References Cited

U.S. PATENT DOCUMENTS

| | | | |
|---|---|---|---|
| 7,965,140 B2 * | 6/2011 | Takahashi | H03F 1/0211 330/10 |
| 8,698,558 B2 | 4/2014 | Mathe et al. | |
| 8,981,846 B2 * | 3/2015 | Wimpenny | H03F 1/0227 330/129 |
| 9,225,302 B2 | 12/2015 | Dakshinamurthy et al. | |
| 9,479,118 B2 | 10/2016 | Khlat et al. | |
| 9,602,057 B1 * | 3/2017 | Youn | H03F 1/0211 |
| 2008/0278136 A1 | 11/2008 | Murtojarvi et al. | |
| 2013/0135043 A1 | 5/2013 | Hietala et al. | |
| 2015/0137776 A1 * | 5/2015 | Thomas | H02M 3/1588 323/271 |
| 2015/0358486 A1 | 12/2015 | Wimpenny et al. | |
| 2016/0103479 A1 | 4/2016 | Drogi et al. | |
| 2016/0294587 A1 | 10/2016 | Jiang et al. | |
| 2018/0048265 A1 * | 2/2018 | Nentwig | H03F 1/0227 |

* cited by examiner

SELECTING BETWEEN BOOSTED SUPPLY AND BATTERY SUPPLY

CROSS-REFERENCE TO RELATED APPLICATIONS

This application claims benefit of priority to provisional application No. 62/368,930, filed Jul. 29, 2016, which is expressly incorporated herein by reference in its entirety.

TECHNICAL FIELD

Certain aspects of the present disclosure generally relate to electronic circuits and, more particularly, to amplification systems.

BACKGROUND

Wireless communication networks are widely deployed to provide various communication services such as telephony, video, data, messaging, broadcasts, and so on. Such networks, which are usually multiple access networks, support communications for multiple users by sharing the available network resources. For example, one network may be a 3G (the third generation of mobile phone standards and technology), 4G, 5G, or later system, which may provide network service via any one of various radio access technologies (RATs) including EVDO (Evolution-Data Optimized), 1×RTT (1 times Radio Transmission Technology, or simply 1x), W-CDMA (Wideband Code Division Multiple Access), UMTS-TDD (Universal Mobile Telecommunications System-Time Division Duplexing), HSPA (High Speed Packet Access), GPRS (General Packet Radio Service), or EDGE (Enhanced Data rates for Global Evolution). Such multiple access networks may also include code division multiple access (CDMA) systems, time division multiple access (TDMA) systems, frequency division multiple access (FDMA) systems, orthogonal frequency division multiple access (OFDMA) systems, single-carrier FDMA (SC-FDMA) networks, $3^{rd}$ Generation Partnership Project (3GPP) Long Term Evolution (LTE) networks, and Long Term Evolution Advanced (LTE-A) networks. Other examples of wireless communication networks may include WiFi (in accordance with IEEE 802.11), WiMAX (in accordance with IEEE 802.16), and Bluetooth® networks.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station.

Amplifiers (e.g., transimpedance amplifiers, inverting amplifiers, etc.) may be used in a variety of systems (which may be referred to as amplification systems) to increase the power of an input signal, including for wireless communication systems. For example, amplifiers may be used in radio frequency (RF) systems, to increase the power of a signal for transmission, or increase the power of a received signal.

Such RF systems may implement envelope tracking, in which the power supply voltage to the amplifier is adjusted so as to roughly track the envelope of a signal for transmission.

SUMMARY

Certain aspects of the present disclosure provide an envelope tracking power supply. The envelope tracking power supply may include a linear amplifier having an output coupled to a voltage supply node of an amplifier, wherein a power supply node of the linear amplifier is coupled to a first voltage supply node, a switch mode power supply (SMPS) having an output coupled to the voltage supply node of the amplifier, and a circuit having a first switch coupled to the first voltage supply node and a second switch coupled to a second voltage supply node, wherein the power supply node of the SMPS is coupled to the first switch and the second switch.

Certain aspects of the present disclosure provide a method for generating a power supply voltage. The method generally includes generating, via a linear amplifier the power supply voltage at a power supply node of an amplifier based on an envelope of an input signal to the amplifier and a voltage at a first voltage supply node, selecting the first voltage supply node or a second voltage supply node based on the envelop of the input signal, and supplying, via a switch mode power supply (SMPS), a current to the power supply node from the first voltage supply node or the second voltage supply node based on the selection.

Certain aspects of the present disclosure generally includes an apparatus for generating a power supply voltage. The apparatus generally includes a linear regulator configured to generate the power supply voltage at a power supply node of a means for amplifying based on an envelope of an input signal to the means for amplifying and a voltage at a first voltage supply node, means for selecting the first voltage supply node or a second voltage supply node based on the envelop of the input signal, and a switch mode power supply configured to supply a current to the power supply node from the first voltage supply node or the second voltage supply node based on the selection.

Certain aspects of the present disclosure provide an envelope tracking power supply. The envelope tracking power supply generally includes one or more switches coupled to a battery voltage and a boosted voltage, a switching mode power supply coupled to the switches and to an amplifier, and a linear amplifier coupled to the boosted voltage and the amplifier.

Certain aspects of the present disclosure provide an apparatus. The apparatus generally includes a selection circuit configured to selectively output a battery voltage and a boosted voltage, a switch mode power supply coupled to the output of the selection circuit and to a power amplifier, and a linear amplifier coupled to the boosted voltage and to the power amplifier. The apparatus may further include an inductor coupled between the switch mode power supply and the power amplifier. The switch mode power supply may be configured as a buck converter. The apparatus may further include an envelope detector coupled to an input of the linear amplifier. The selection circuit may include a first switch coupled between the battery voltage and an output of the selection circuit, and a second switch coupled between the boosted voltage and the output of the selection circuit.

The selection circuit may further include a demultiplexer coupled between gates of the first switch and the second switch.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Various aspects of the present disclosure are described below. It should be apparent that the teachings herein may be embodied in a wide variety of forms and that any specific structure, function, or both being disclosed herein is merely representative. Based on the teachings herein, one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein. Furthermore, an aspect may comprise at least one element of a claim.

The word "exemplary" is used herein to mean "serving as an example, instance, or illustration." Any aspect described herein as "exemplary" is not necessarily to be construed as preferred or advantageous over other aspects.

The techniques described herein may be used in combination with various wireless technologies such as Code Division Multiple Access (CDMA), Orthogonal Frequency Division Multiplexing (OFDM), Time Division Multiple Access (TDMA), Spatial Division Multiple Access (SDMA), Single Carrier Frequency Division Multiple Access (SC-FDMA), Time Division Synchronous Code Division Multiple Access (TD-SCDMA), and so on. Multiple user terminals can concurrently transmit/receive data via different (1) orthogonal code channels for CDMA, (2) time slots for TDMA, or (3) sub-bands for OFDM. A CDMA system may implement IS-2000, IS-95, IS-856, Wideband-CDMA (W-CDMA), or some other standards. An OFDM system may implement Institute of Electrical and Electronics Engineers (IEEE) 802.11, IEEE 802.16, Long Term Evolution (LTE) (e.g., in TDD and/or FDD modes), or some other standards. A TDMA system may implement Global System for Mobile Communications (GSM) or some other standards. These various standards are known in the art.

An Example Wireless System

Figure 1:
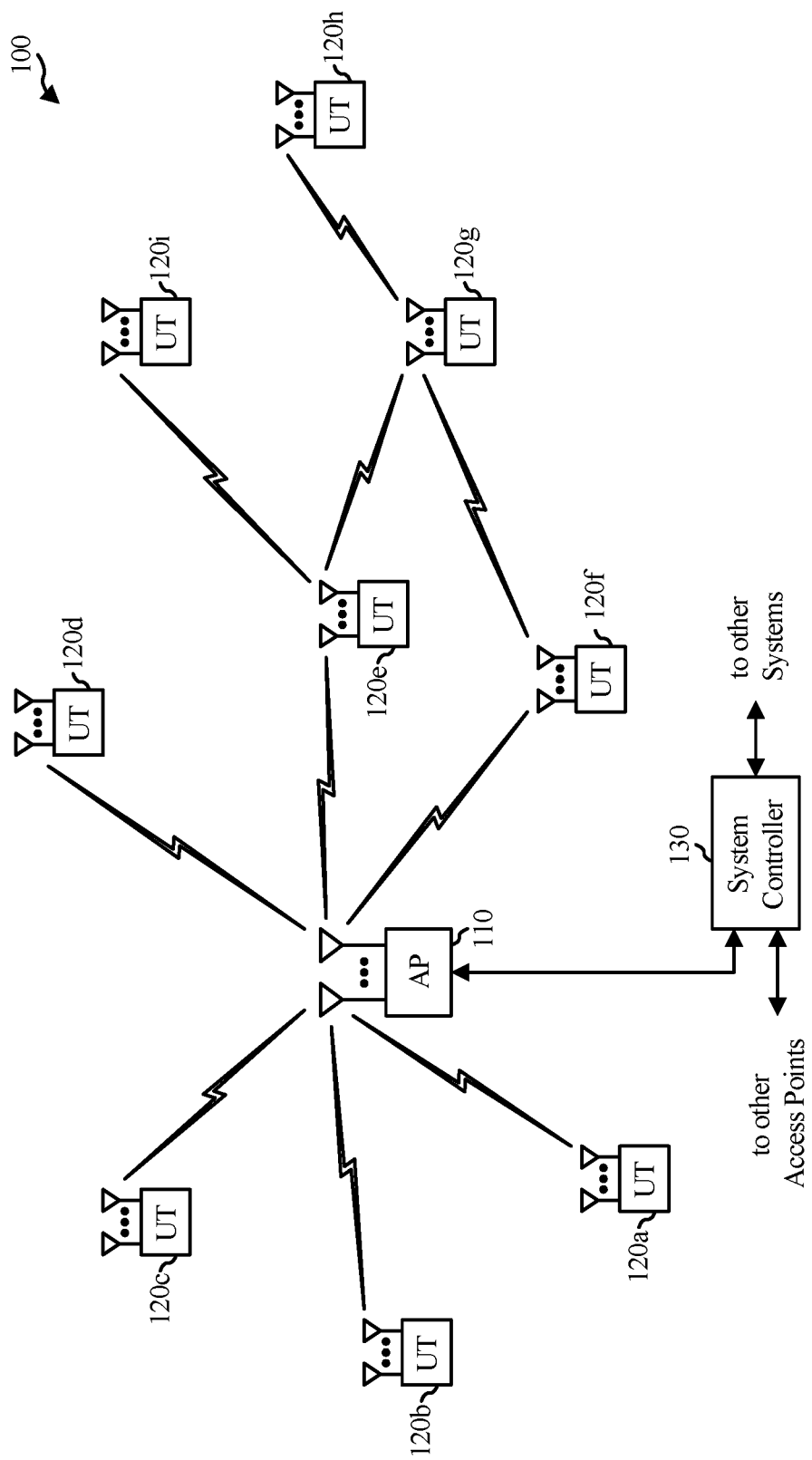
FIG. 1 is a diagram of an example wireless communications network, in accordance with certain aspects of the present disclosure.

FIG. 1 illustrates a wireless communications system 100 with access points 110 and user terminals 120. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal 120 may be equipped with a single antenna (e.g., in order to keep costs down) or multiple antennas (e.g., where the additional cost can be supported).

The access point 110 and/or user terminal 120 may include one or more amplifiers to amplify signals. At least one of the amplifiers may be designed in accordance with certain aspects of the present disclosure.

Figure 2:
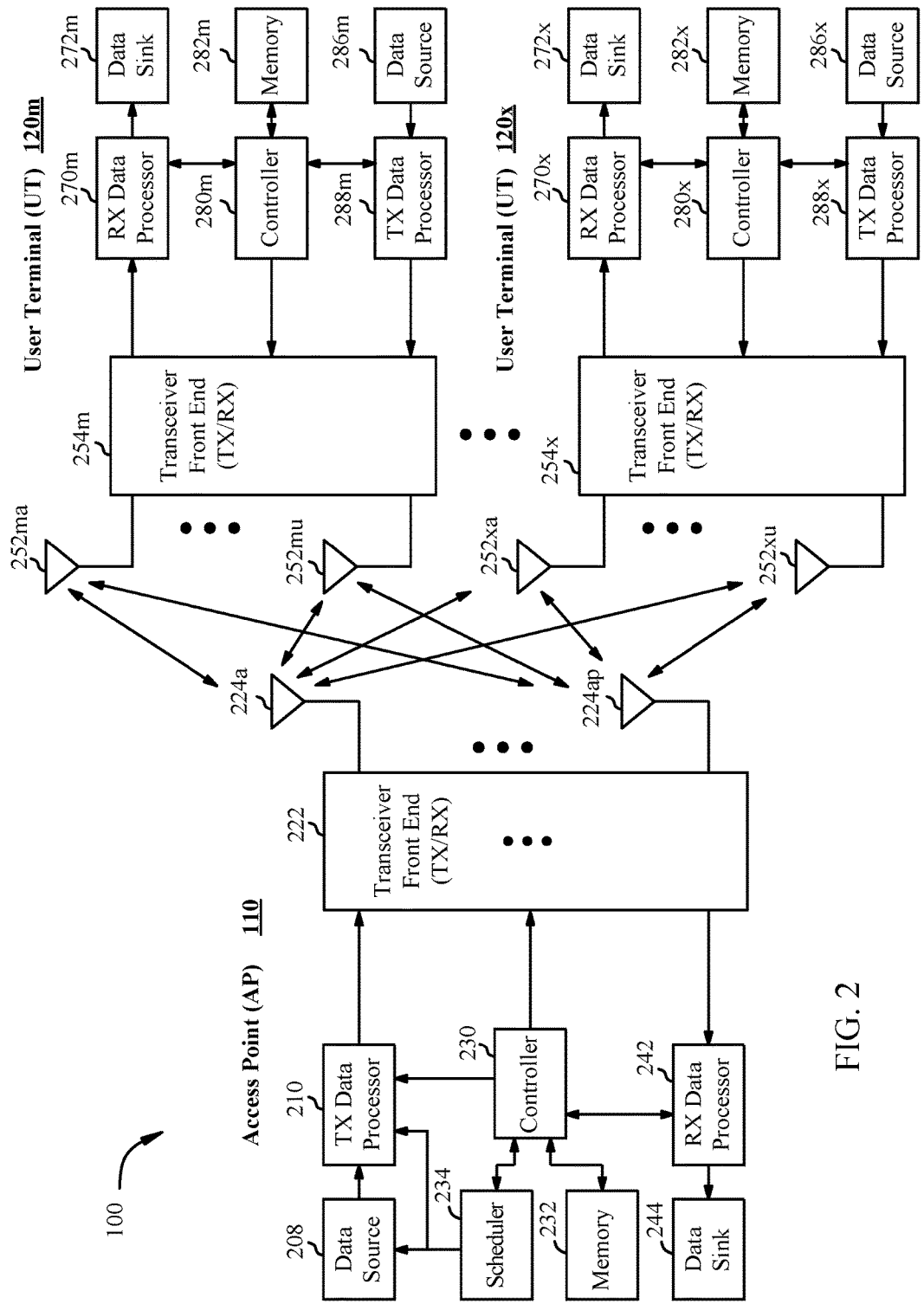
FIG. 2 is a block diagram of an example access point (AP) and example user terminals, in accordance with certain aspects of the present disclosure.

FIG. 2 shows a block diagram of access point 110 and two user terminals 120m and 120x in wireless system 100. In some embodiments, the access point 110 is instead implemented as a base station and/or one or more of the user terminals 120 are instead implemented as a mobile station. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals may be selected for simultaneous transmission on the uplink, $N_{dn}$ user terminals may be selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point, base station, mobile station, and/or user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver/front end (TX/RX) 254 (also known as a radio frequency front end (RFFE)) receives and processes (e.g., converts to analog, amplifies, filters, and frequency upconverts) a respective symbol stream to generate an uplink signal. The transceiver/front end 254 may also route the uplink signal to one of the $N_{ut,m}$ antennas for transmit diversity via an RF switch, for example. The controller 280 may control the routing within the transceiver/front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver/front end 222 may select signals received from one of the antennas 224 for processing. The signals received from multiple antennas 224 may be combined for enhanced receive diversity. The access point's transceiver/front end 222 also performs processing complementary to that performed by the user terminal's transceiver/front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

The transceiver front end (TX/RX) 222 of access point 110 and/or transceiver/front end 254 of user terminal 120 may include one or more amplifiers to amplify signals. At least one of the amplifiers may be designed in accordance with certain aspects of the present disclosure. While FIG. 2 illustrates the transceiver/front end 254 in a single box, those of skill in the art will appreciate that elements of the transceiver/front end 254 may be implemented across various elements, chips, modules, etc. For example, down and/or upconversion elements may be included in a transceiver chip within the transceiver/front end 254, while a power amplifier and/or envelope tracking elements may be implemented in a module separate from the transceiver chip within the transceiver/front end 254.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol stream for one of more of the $N_{dn}$ user terminals to be transmitted from one of the $N_{ap}$ antennas. The transceiver/front end 222 receives and processes (e.g., converts to analog, amplifies, filters, and frequency upconverts) the symbol stream to generate a downlink signal. The transceiver/front end 222 may also route the downlink signal to one or more of the $N_{ap}$ antennas 224 for transmit diversity via an RF switch, for example. The controller 230 may control the routing within the transceiver/front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver/front end 254 may select signals received from one of the antennas 252 for processing. The signals received from multiple antennas 252 may be combined for enhanced receive diversity. The user terminal's transceiver/front end 254 also performs processing complementary to that performed by the access point's transceiver/front end 222 and provides a recovered downlink data symbol stream. An RX data processor 270 processes (e.g., demodulates, deinterleaves, and decodes) the recovered downlink data symbol stream to obtain decoded data for the user terminal.

Those skilled in the art will recognize the techniques described herein may be generally applied in systems utilizing any type of multiple access schemes, such as TDMA, SDMA, Orthogonal Frequency Division Multiple Access (OFDMA), CDMA, SC-FDMA, TD-SCDMA, and combinations thereof, among other systems/schemes.

Figure 3:
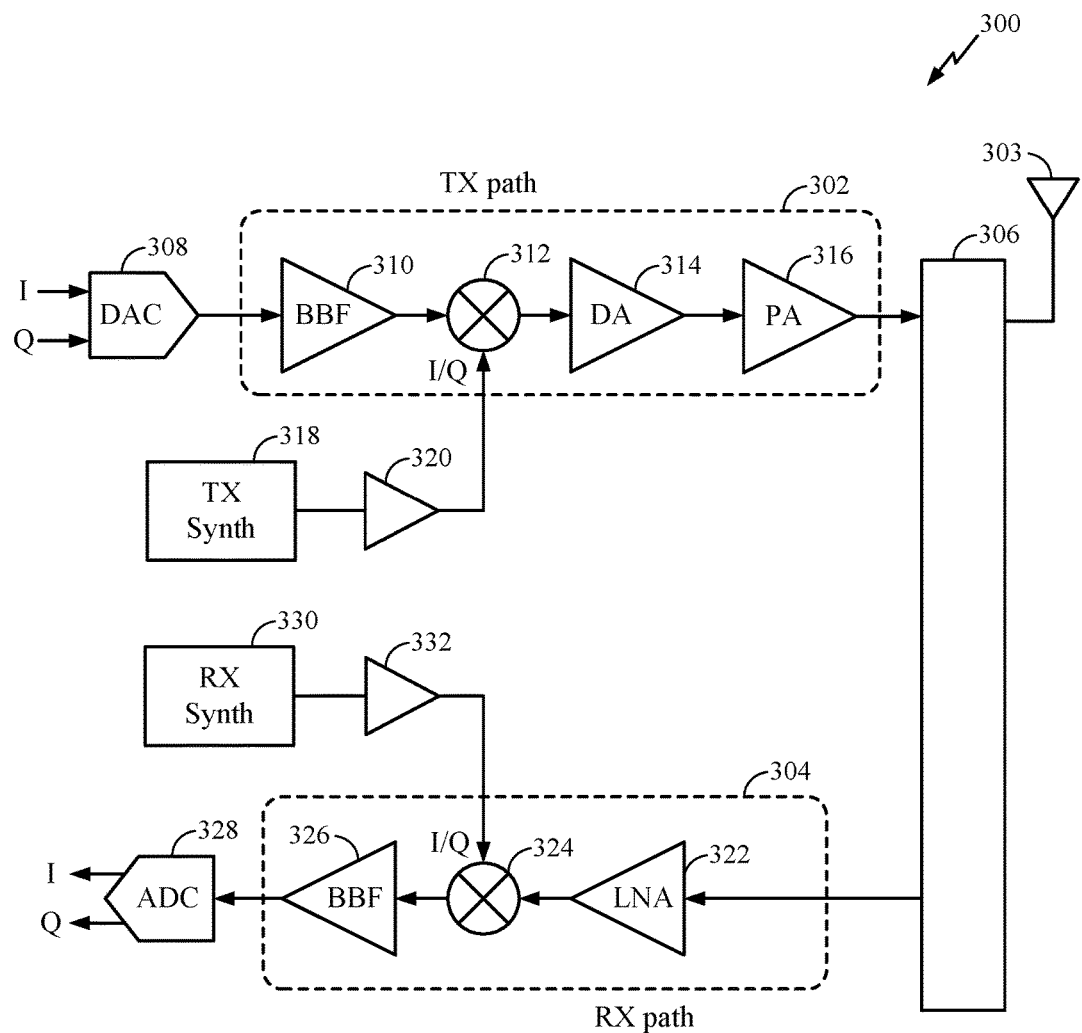
FIG. 3 is a block diagram of an example transceiver front end, in accordance with certain aspects of the present disclosure.

FIG. 3 is a block diagram of an example transceiver/front end 300, such as transceiver/front ends 222, 254 in FIG. 2, in accordance with certain aspects of the present disclosure. The transceiver/front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which are amplified by the DA 314 and by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning to different frequencies indicates using a variable-frequency oscillator, which may involve compromises between stability and tunability. Contemporary systems may employ frequency synthesizers with a VCO to generate a stable, tunable LO with a particular tuning range. Thus, the transmit LO may be produced by a TX frequency synthesizer 318, which may be buffered or amplified by amplifier 320 before being mixed with the baseband signals in the mixer 312. Similarly, the receive LO may be produced by an RX frequency synthesizer 330, which may be buffered or amplified by amplifier 332 before being mixed with the RF signals in the mixer 324. The transceiver/front end 300 may, for example, be configured for operation in quadrature or polar.

The PA 316 may be designed in accordance with certain aspects described herein. For example, the power supply to the PA 316 may comprise an envelope tracking supply modulator in accordance with certain aspects described herein. The envelope tracking supply modulator may be configured to adjust the power supply of the PA 316, such that the power supplied to the PA 316 is based on or substantially tracks the envelope (e.g., envelope waveform) of the signal to be amplified by the PA 316.

Figure 4:
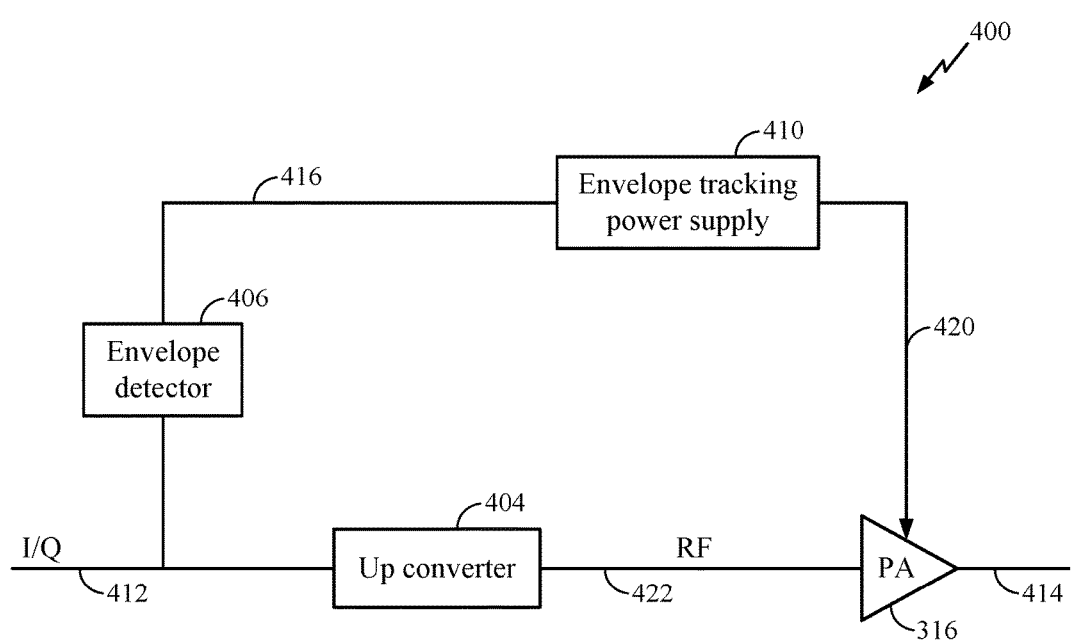
FIG. 4 illustrates an example envelope tracking amplification system.

FIG. 4 illustrates an example envelope tracking amplification system 400. The envelope tracking amplification system 400 may include a power amplifier 316, an up-converter 404, an envelope detector 406, and an envelope tracking power supply 410. As illustrated, the amplifier 316 may be configured to amplify an input signal 412. The input signal 412 may represent an in-phase (I) or quadrature-phase (Q) signal. In some cases, the input signal may form an input to the up-converter 404, which generates an RF input signal 422 for the amplifier 316.

The input signal 412 also forms an input to the envelope detector 406, which generates an envelope signal 416 representing the envelope of the input signal 412 (e.g., provides a signal representing the magnitude of the input signal 412).

The envelope signal 416 of the envelope detector 406 provides an input to the envelope tracking power supply 410, which in dependence thereon provides a supply voltage at the power supply node 420 to the amplifier 316. Therefore, the supply voltage at the power supply node 420 of the amplifier is adjusted based on (e.g., tracks) the envelope of the input signal 412. The amplifier 316 generates an amplified output signal 414 based on the input signal 412 (and RF input signal 422). The amplifier 316 may be implemented as a single stage or multi-stage amplifier.

An Example Envelope Tracking Power Supply

Certain aspects of the present disclosure generally relate to an envelope tracking power supply. Envelope tracking integrated circuits (ETICs) may be designed with high output fidelity (low error vector magnitude (EVM)) and low output noise, in addition to high conversion efficiency. For example, envelope tracking power supplies may be designed with a switching mode power supply (SMPS) in order to take advantage of their high power efficiency. For example, the SMPS may be coupled in parallel with a linear regulator such that both the SMPS and the linear regulator provide current to the power supply node 420 of the amplifier 316.

Figure 5:
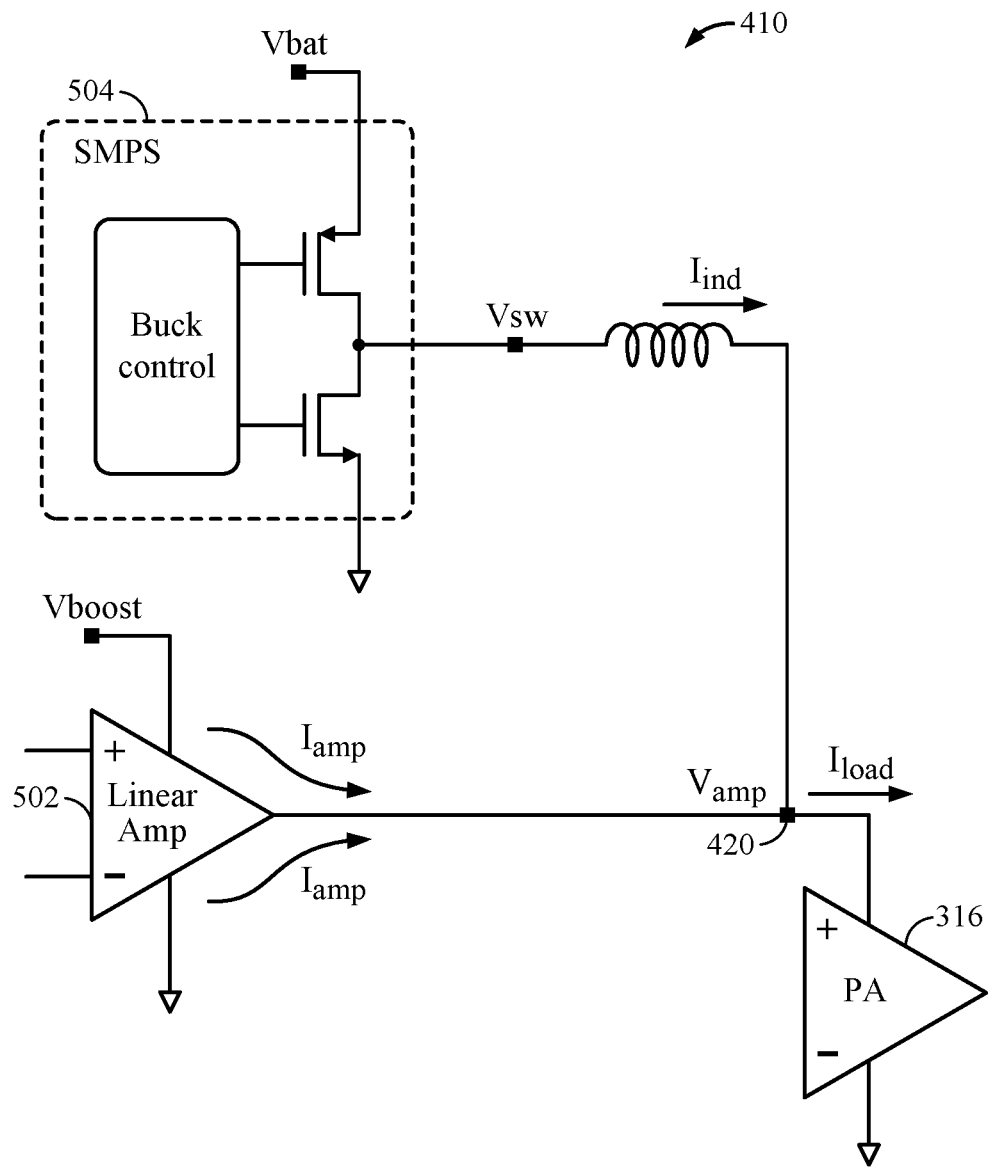
FIG. 5 illustrates an example envelope tracking power supply.

FIG. 5 illustrates an example envelope tracking power supply 410 for generating a voltage supply Vamp for amplifier 316. The envelope tracking power supply 410 includes a linear regulator 502 (e.g., linear amplifier) which may be configured to generate the power supply voltage Vamp which tracks the envelope signal 416 of FIG. 4. The envelope tracking power supply 410 also includes a regulator 504 (e.g., a SMPS) which may have a higher power efficiency as compared to the regulator 502. The regulator 502 may be supplied a voltage (Vboost) which may be a higher voltage than a voltage (e.g., battery voltage Vbat) supplied to the regulator 504. For example, the voltage Vboost may be generated by a boost converter (not shown). As illustrated, the regulator 502 provides a current Iamp, which may be combined with a current Iind from the regulator 504, and flows to the power supply node 420 of the amplifier 316. Therefore, the current Iamp may be represented by the following equation:

$$Iamp = Iload - Iind.$$

In certain aspects, the regulator 504 may be implemented using a buck converter. The buck converter may be configured to efficiently supply a current to node 420, for example when the supply voltage (e.g., the battery voltage Vbat) provided to the buck converter is higher than the voltage at node 420 (e.g., Vamp). Therefore, when the voltage of Vamp, which is generated based on the envelope of the input signal 412, is greater than the battery voltage (Vbat), the regulator 504 (e.g., SMPS) may be unable to supply power (current) to the power supply node 420, reducing the ETIC's overall efficiency since more current may be supplied by the regulator 502. Moreover, if Vamp increases above Vbat, current may back flow to Vbat from the boost converter generating Vboost. In otherwords, current from the boost converter may flow through the regulator 502 and the regulator 504, and back flow to the battery providing Vbat, further reducing ETIC's overall efficiency.

Figure 6:
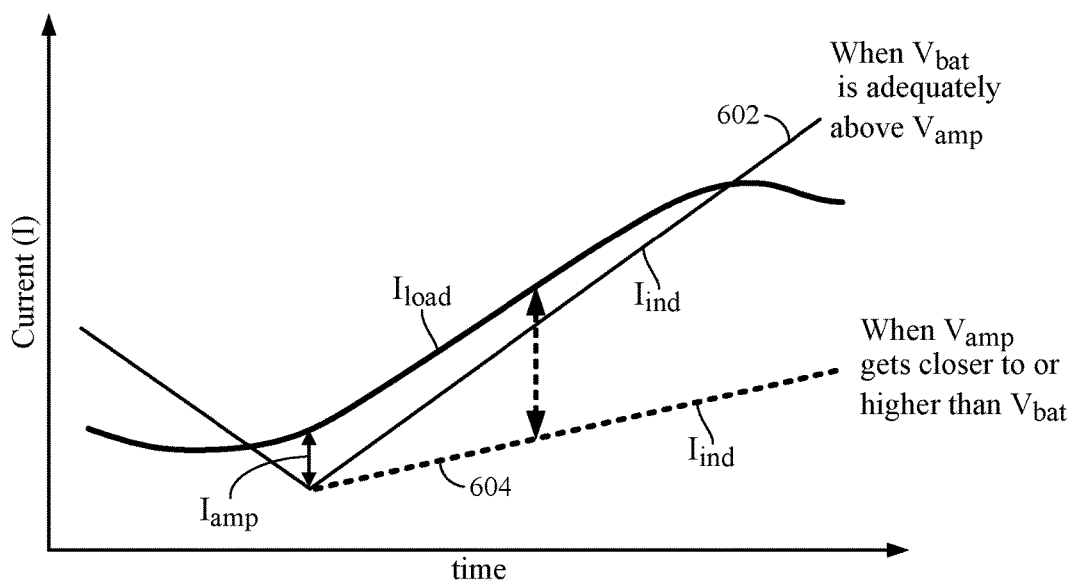
FIG. 6 illustrates a graph of currents generated by the envelope tracking power supply of FIG. 5.

FIG. 6 is a graph illustrating the current Iind supplied by the regulator 504 and the load current Iload supplied to the amplifier 316 in certain implementations of the envelope tracking power supply 410 illustrated in FIG. 5. The line 602 represents the current Iind when Vbat is adequately above Vamp and the dotted line 604 represents the current Iind when the Vamp is closer to or higher than Vbat. As illustrated, the difference between the current Iload and the current Iind increases when Vamp is close to or exceeds Vbat. Since, the difference in the currents Iload and Iind is supplied by the regulator 502 (e.g., linear regulator) which is less efficient that the regulator 504, the overall efficiency of the ETIC is reduced.

Figure 7:
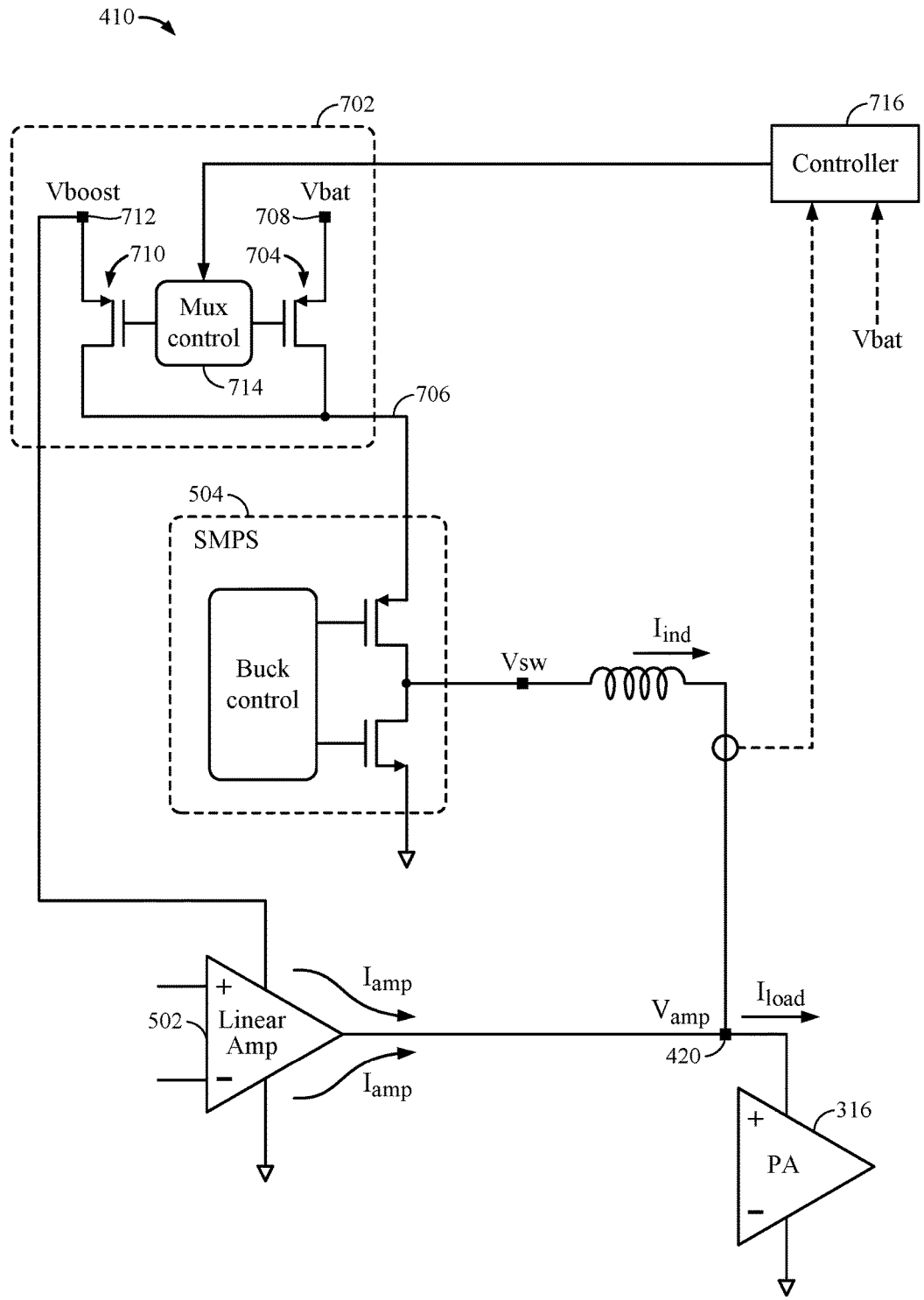
FIG. 7 illustrates an example envelope tracking power supply, in accordance with certain aspects of the present disclosure.

FIG. 7 illustrates an example envelope tracking power supply 410, in accordance with certain aspects of the present disclosure. The voltage supply node 706 of the regulator 504 may be coupled to a circuit 702 for selecting between two voltages Vbat and Vboost. For example, the circuit 702 may provide either one of Vbat or Vboost to the voltage supply node 706 based on a voltage of Vamp (e.g., the envelope of the input signal 412 from FIG. 4). The circuit 702 may include a first switch 704 coupled between node 708 (Vbat) and the voltage supply node 706 and a second switch 710 coupled between node 712 (Vboost) and the voltage supply node 706. In certain aspects, the switches 704 and 710 may be implemented using transistors such as p-channel metal oxide semiconductor (PMOS) transistors.

In certain aspects, the switches 704 and 710 may be controlled via a demultiplexer 714 that may be configured to close switch 704 when Vamp (e.g., the envelope of the input signal 412) is below Vbat and close switch 710 when Vamp is close to or above Vbat. In certain aspects, the demultiplexer 714 may be controlled by baseband circuitry based on the envelope of the input signal 412.

In certain aspects, the demultiplexer 714 may be controlled by a controller 716. In certain aspects, the controller 716 may be a comparator for comparing Vamp and Vbat and the switches 704 and 710 may be controlled based on the output of the comparator. That is, if the comparator output indicates that the Vamp is greater than Vbat, the switch 710 may be closed, and the switch 704 may be open. If the comparator output indicates that Vamp is less than Vbat, the switch 704 may be closed, and the switch 710 may be open. In certain aspects, the selection of Vboost and Vbat may be performed statically based on the peak value of Vamp, instead of switching real time when Vamp crosses Vbat. In some cases, the controller 716 may be implemented in a baseband module including baseband circuitry as described with respect to FIG. 2, and the baseband module may control the demultiplexer 714. Those of skill in the art will appreciate that the selection circuit 702 may be implemented in any number of ways or with any number of different elements such that either Vboost or Vbat is selectively provided to the voltage supply node 706. While FIG. 7 illustrates an example configuration of the circuit 702, other configurations may be implemented according to the teachings herein.

Certain of the apparatus and techniques provided herein may increase the efficiency of the envelope tracking power supply 410. For example, power loss of the regulator 504 may be a function of the difference between the power supply voltage of the regulator 504 and the regulated output (Vamp). By supplying a relatively lower voltage Vbat (e.g., as compared Vboost) to the regulator 504 when Vbat is greater than Vamp, the power loss of the regulator 504 may be reduced, improving ETIC power efficiency. A higher voltage (Vboost) may be provided when Vamp exceeds (or gets close to) Vbat such that the regulator 504 can continue to provide current Iind to the power supply node 420. Moreover, supplying Vbat to the regulator 504 may also reduce the receive-band noise (RxBN) caused by the ETIC. Such implementations may be more cost effective than certain implementations in which the regulator 504 is replaced by a buck/boost converter which receives only the voltage Vbat, for example because circuitry required to implement the boost may be omitted and the Vboost supplied to the regulator 502 may be additionally supplied to the regulator 504.

Figure 8:
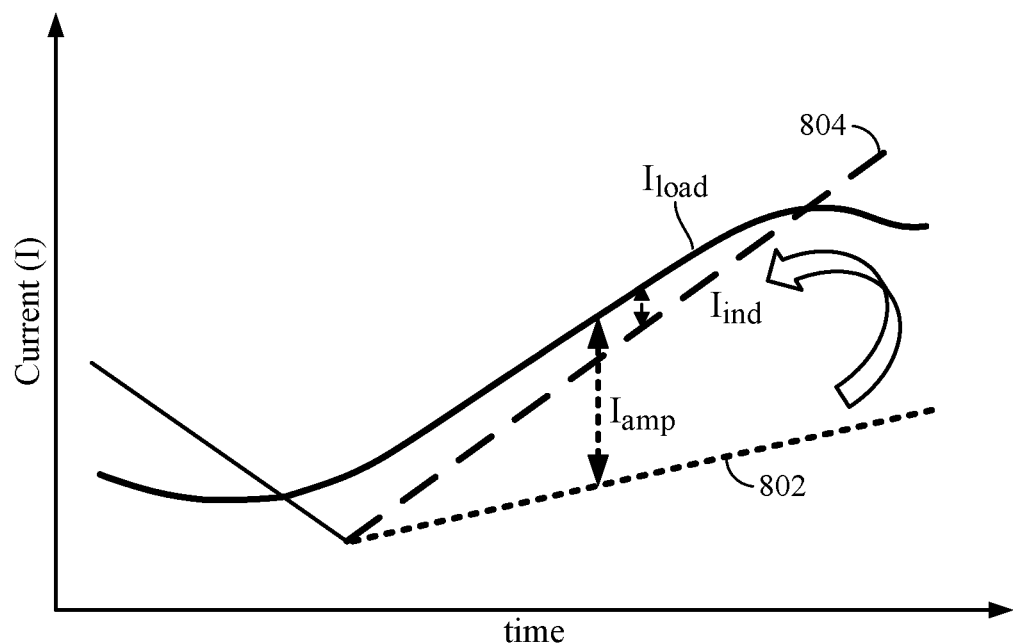
FIG. 8 illustrates a graph of currents generated by the envelope tracking power supply of FIG. 7, in accordance with certain aspects of the present disclosure.

FIG. 8 is a graph illustrating the current Iind supplied by the regulator 504 and the load current Iload, in accordance with certain implementations of the envelope tracking power supply 410 illustrated in FIG. 7. The line 802 represents the current Iind when the regulator 504 is being supplied with Vbat and Vamp is close to or exceeds Vbat. The line 804 represents the current Iind when the circuit 702 has switched the supply voltage of the regulator 504 from Vbat to Vboost, increasing the current Iind. As illustrated, the difference between the currents Iload and Iind is reduced when the circuit 702 has switched the supply voltage of the regulator 504 from Vbat to Vboost, reducing the amount of current Iamp to be supplied by regulator 502, improving overall ETIC efficiency.

Figure 9:
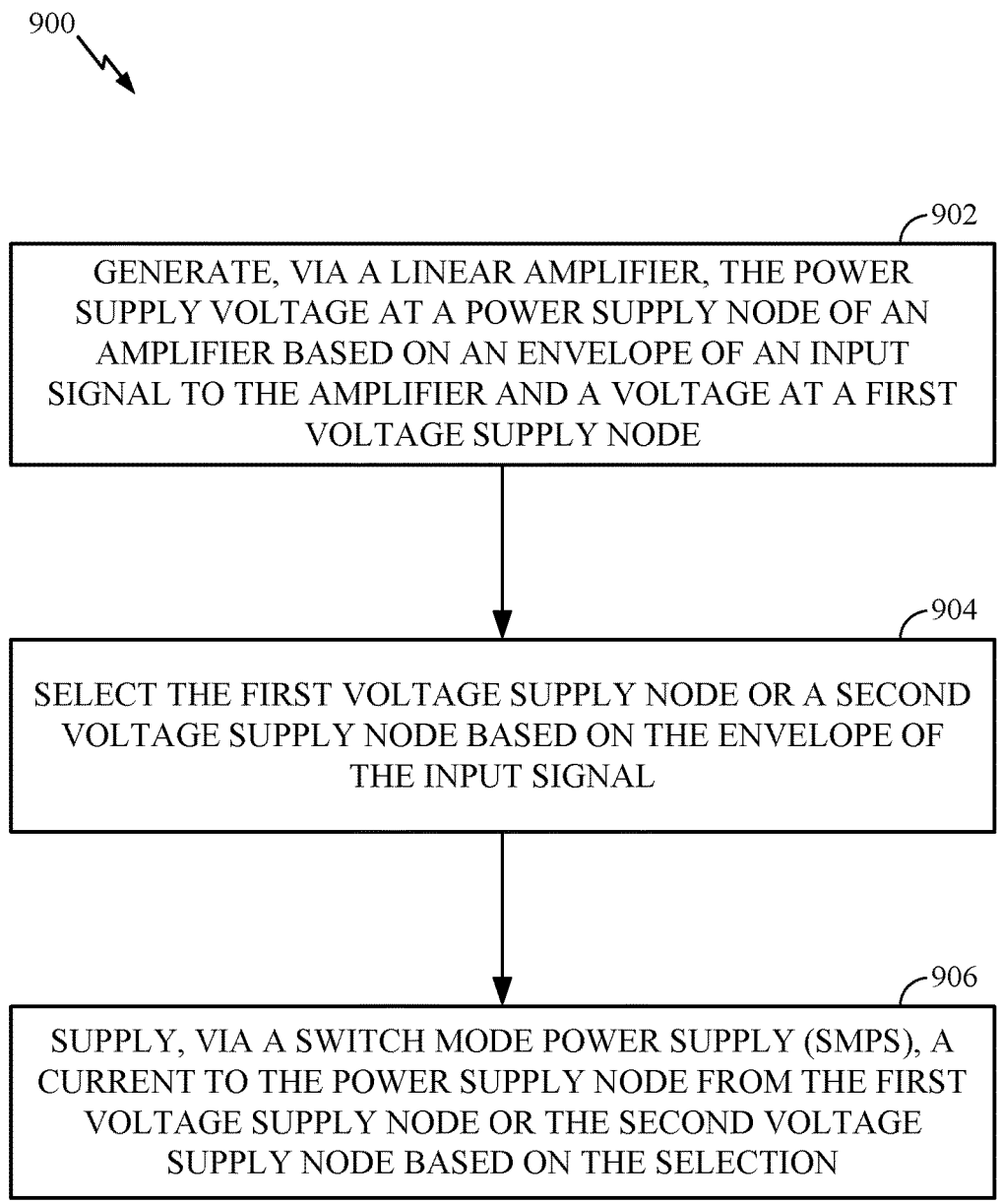
FIG. 9 illustrates example operations for generating a power supply voltage, in accordance with certain aspects of the present disclosure.

FIG. 9 illustrates example operations 900 for generating a power supply voltage (e.g., Vamp), in accordance with certain aspects of the present disclosure. The operations 900 may be performed, for example, by a circuit such as the circuit of FIG. 7.

The operations 900 begin at 902, by generating, via a linear amplifier (e.g., regulator 502), the power supply voltage (e.g., Vamp) at a power supply node (e.g., node 420) of an amplifier (e.g., amplifier 316) or amplifying means based on an envelope of an input signal (e.g., input signal 412) to the amplifier or amplifying means and a voltage at a first voltage supply node. At 904, the operations 900 continue by selecting the first voltage supply node (e.g., Vboost) or a second voltage supply node (e.g., Vbat) based on the envelope of the input signal, and at 906, supplying, via a switch mode power supply (e.g., regulator 504) a current (e.g., Iind) to the power supply node (e.g., node 420) from the first voltage supply node or the second voltage supply node based on the selection. In certain aspects, the selecting the first voltage supply node or the second voltage supply node comprises coupling the first voltage supply node or the second voltage supply node to a power supply node of the SMPS. The selection may be performed by a controller (e.g., the controller 716), a baseband module, the selection circuit 702, and/or other means for selecting.

In some cases, the operations 900 also include comparing the envelope of the input signal to a voltage at the second voltage supply node, wherein the selecting is based on the comparison. In some cases, the selecting is based on a control signal received from a baseband module. In some cases, the voltage at the first voltage supply node is higher than a voltage at the second voltage supply node. In this case, the voltage at the second voltage supply node comprises a battery voltage.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the physical (PHY) layer. In the case of a user terminal, a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC with the processor, the bus interface, the user interface in the case of an access terminal), supporting circuitry, and at least a portion of the machine-readable media integrated into a single chip, or with one or more FPGAs, PLDs, controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. An envelope tracking power supply, comprising:
   a linear amplifier having an output coupled to a power supply node of an amplifier, wherein a power supply node of the linear amplifier is coupled to a first voltage supply node over a first path;
   a switch mode power supply (SMPS) having an output coupled to the power supply node of the amplifier; and
   a circuit having a first switch coupled to the first voltage supply node and a second switch coupled to a second voltage supply node, wherein a power supply node of the SMPS is coupled to the first switch and the second switch at an output of the circuit over a second path, the first path being separate from the second path, and the output of the SMPS being separate from the second path.

2. The envelope tracking power supply of claim 1, further comprising:
   a demultiplexer coupled to the first switch and the second switch.

3. The envelope tracking power supply of claim 2, wherein the demultiplexer is configured to control the first switch and the second switch based on a control signal, wherein the control signal is generated based on an envelope of an input signal to the amplifier and a voltage at the first voltage supply node.

4. The envelope tracking power supply of claim 1, wherein:
   the second switch couples the second voltage supply node to the power supply node of the SMPS when an envelope of an input signal to the amplifier is less than a voltage at the second voltage supply node; and
   the first switch couples the first voltage supply node to the power supply node of the SMPS when the envelope of the input signal is greater than the voltage at the second voltage supply node.

5. The envelope tracking power supply of claim 1, wherein a voltage at the first voltage supply node is higher than a voltage at the second voltage supply node.

6. The envelope tracking power supply of claim 5, wherein the first voltage supply node is coupled to an output of a battery.

7. The envelope tracking power supply of claim 1, wherein the SMPS comprises a buck converter.

8. An envelope tracking power supply, comprising:
   a linear amplifier having an output coupled to a power supply node of an amplifier, wherein a power supply node of the linear amplifier is coupled to a first voltage supply node;
   a switch mode power supply (SMPS) having an output coupled to the power supply node of the amplifier;
   a circuit having a first switch coupled to the first voltage supply node and a second switch coupled to a second voltage supply node, wherein a power supply node of the SMPS is coupled to the first switch and the second switch; and a controller having an input coupled to an input node of the amplifier and the first voltage supply node, wherein the first switch and the second switch are coupled to an output of the controller.

9. The envelope tracking power supply of claim 1, further comprising an inductor coupled between the SMPS and the amplifier.

10. The envelope tracking power supply of claim 1, further comprising:

an envelope detector coupled to an input of the linear amplifier.

11. The envelope tracking power supply of claim 1, wherein the amplifier comprises a power amplifier.

12. A method for generating a power supply voltage, comprising:

generating, via a linear amplifier, the power supply voltage at a power supply node of an amplifier based on an envelope of an input signal to the amplifier and a voltage at a first voltage supply node;

selecting the first voltage supply node or a second voltage supply node based on the envelope of the input signal; and supplying, via a switch mode power supply (SMPS), a current to the power supply node from the first voltage supply node or the second voltage supply node based on the selection.

13. The method of claim 12, wherein the selecting the first voltage supply node or the second voltage supply node comprises coupling the first voltage supply node or the second voltage supply node to a power supply node of the SMPS.

14. The method of claim 12, further comprising comparing the envelope of the input signal to a voltage at the second voltage supply node, wherein the selecting is based on the comparison.

15. The method of claim 12, wherein the selecting is based on a control signal received from a baseband module.

16. The method of claim 12, wherein the voltage at the first voltage supply node is higher than a voltage at the second voltage supply node.

17. The method of claim 16, wherein the voltage at the second voltage supply node comprises a battery voltage.

18. An apparatus for generating a power supply voltage, comprising:

a linear regulator configured to generate the power supply voltage at a power supply node of a means for amplifying based on an envelope of an input signal to the means for amplifying and a voltage at a first voltage supply node;

means for selecting the first voltage supply node or a second voltage supply node based on the envelope of the input signal; and a switch mode power supply (SMPS) configured to supply a current to the power supply node from the first voltage supply node or the second voltage supply node based on the selection.

* * * * *